United States Patent
Shimizu et al.

(10) Patent No.: US 6,445,076 B1
(45) Date of Patent: Sep. 3, 2002

(54) INSULATING ADHESIVE FOR ELECTRONIC PARTS, AND LEAD FRAME AND SEMICONDUCTOR DEVICE USING THE SAME

(75) Inventors: Takehiro Shimizu, Ichihara (JP);
Takafumi Dohdoh, Ichihara (JP);
Kazumi Tameshige, Ichihara (JP);
Hidekazu Matsuura, Ichihara (JP);
Yoshihiro Nomura, Ichihara (JP);
Kunihiro Tsubosaki, Hino (JP);
Toshihiro Shiotsuki, Koganei (JP);
Kazunari Suzuki, Tokyo (JP); Tomoko Higashino, Tokyo (JP)

(73) Assignees: Hitachi Chemical Company, Ltd., Tokyo (JP); Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/700,491
(22) PCT Filed: May 18, 1999
(86) PCT No.: PCT/JP99/02577
§ 371 (c)(1), (2), (4) Date: Nov. 16, 2000
(87) PCT Pub. No.: WO99/60622
PCT Pub. Date: Nov. 25, 1999

(30) Foreign Application Priority Data
May 20, 1998 (JP) .............................. 10-137851

(51) Int. Cl.[7] .................. H01L 23/48; H01L 23/52; H01L 29/40
(52) U.S. Cl. .......................... 257/783; 257/676
(58) Field of Search ................. 257/783, 782, 257/676

(56) References Cited

U.S. PATENT DOCUMENTS

| | | | |
|---|---|---|---|
| 5,683,806 A | * | 11/1997 | Sakumoto et al. |
| 5,807,768 A | * | 9/1998 | Shin |
| 5,891,566 A | * | 4/1999 | Sakumoto et al. |
| 6,132,865 A | * | 10/2000 | Oka et al. |
| 6,228,452 B1 | * | 5/2001 | Oka et al. |
| 6,372,080 B1 | * | 4/2002 | Matsura et al. |
| 6,372,859 B1 | * | 4/2002 | Sakata et al. |

FOREIGN PATENT DOCUMENTS

| EP | 0013767 | 8/1980 |
|---|---|---|
| JP | 62-151458 | 7/1987 |
| JP | 5-179220 | 7/1993 |

* cited by examiner

Primary Examiner—Sheila V. Clark
(74) Attorney, Agent, or Firm—Antonelli, Terry, Stout & Kraus, LLP.

(57) ABSTRACT

An insulating adhesive for electronic parts, which is to be used for bonding a semiconductor chip to a lead frame and comprises a resin and a solvent, the resin having (A) a weight average molecular weight (Mw) of 30,000 to 300,000 based on conversion into polystyrene and (B) a ratio of weight average molecular weight (Mw)/number average molecular weight (Mn) of 5 or less, and (C) the insulating adhesive for electronic parts having a viscosity of 5,000 to 100,000 mPa.s at a rotation number of 10 rpm and a viscosity ratio ($\eta 1$ rpm/$\eta 10$ rpm) of 1.0 to 6.0 as measured at 25° C. with an E-type viscometer.

13 Claims, 4 Drawing Sheets (2) C-C′ SECTION

(1) B-B' SECTION (2) C-C' SECTION

(1) A-A' SECTION (a > b)

(2) B-B' SECTION (3) C-C' SECTION

INSULATING ADHESIVE FOR ELECTRONIC PARTS, AND LEAD FRAME AND SEMICONDUCTOR DEVICE USING THE SAME

TECHNICAL FIELD

The present invention relates to an insulating adhesive for electronic parts, which is useful for bonding lead frames to semiconductor chips (chips) in the production of semiconductor devices, particularly LOC (Lead On Chip) or COL (Chip On Lead) semiconductor devices, and also to a lead frame and a semiconductor device using the same.

BACKGROUND ART

To meet the scaling up of semiconductor chips, LOC (Lead On Chip) and COL (Chip On Lead) structures have recently been employed for packaging semiconductor devices. In LOC structures, insulation resin film bearing insulating adhesive layers has been used to bond inner leads to chips. To produce such semiconductor devices, first an insulation resin film bearing insulating adhesive layers is produced and punched with metal molds to stick it to a lead frame. A semiconductor chip is then mounted on the lead frame with heat and pressure. The chip and the lead frame, in general, are connected by bonding wires, such as gold wires, and sealed with resins.

Such semiconductor devices using the insulation resin film bearing insulating adhesive layers suffer from the flash formed on punching and the poor yield factor of the insulation resin film due to the extremely little area used actually, and are also subject to package-cracking during solder reflow for mounting them on substrates due to the hygroscopicity of the materials of the insulation resin film.

DISCLOSURE OF INVENTION

The object of the present invention is to provide an insulating adhesive for electronic parts useful for bonding semiconductor chips to lead frames in the production of semiconductor packages using no insulation resin film, a lead frame and a semiconductor device using the insulating adhesive for electronic parts.

The present invention provides an insulating adhesive for electronic parts (hereinafter may be abbreviated to "insulating adhesive"), which is to be used for bonding a semiconductor chip to a lead frame and comprises a resin and a solvent, wherein the resin having (A) a weight average molecular weight (Mw) of 30,000 to 300,000 based on conversion into polystyrene and (B) a ratio of weight average molecular weight (Mw)/ number average molecular weight (Mn) of 5 or less, and (C) the insulating adhesive for electronic parts having a viscosity of 5,000 to 100,000 mPa.s at a rotation number of 10 rpm and a viscosity ratio ($\eta 1$ rpm/$\eta 10$ rpm) of 1.0 to 6.0 as measured at 25° C. with an E-type viscometer.

When applied to a lead frame, the insulating adhesive for electronic parts of the present invention preferably comes in contact with the lead frame at a contact angle of 20 to 130° and at an aspect ratio of 0.05 to 2.0 before drying, and, after drying, at an aspect ratio of 0.005 or more.

When applied to a lead frame, dried and then forced to absorb moisture, the insulating adhesive for electronic parts of the present invention preferably foams at 200° C. or more.

When applied to a lead frame, dried and then forced to absorb moisture, the insulating adhesive for electronic parts of the present invention preferably has a glass transition temperature of 100 to 250° C.

The present invention further provides a lead frame, which bears an adhesive layer formed by applying the insulating adhesive for electronic parts of the present invention to the lead frame and then drying.

The present invention further provides a semiconductor device comprising a lead frame and a semiconductor chip, the lead frame and the semiconductor chip being bonded together with the insulating adhesive for electronic parts of the present invention.

In a preferred embodiment of the semiconductor device according to the present invention, the lead frame bears an adhesive layer formed by applying the insulating adhesive for electronic parts to the lead frame and then drying, and the semiconductor chip is bonded to the lead frame with the adhesive layer.

In another preferred embodiment of the semiconductor device according to the present invention, 0.05 to 20% area of a surface of the semiconductor chip is in contact with the insulating adhesive for electronic parts.

In another preferred embodiment of the semiconductor device according to the present invention, inner leads of the lead frame are placed over a main circuit surface of the semiconductor chip and are connected to an electrode pad on the semiconductor chip with metal wires, the semiconductor chip, the inner leads and the metal wires are sealed with a sealing material, and at least two of the inner leads are bonded to the semiconductor chip with the insulating adhesive for electronic parts.

In another preferred embodiment of the semiconductor device according to the present invention, inner leads of the lead frame are placed over a main circuit surface of the semiconductor chip and are connected to an electrode pad on the semiconductor chip with metal wires, the semiconductor chip, the inner leads and the metal wires are sealed with a sealing material, power supply inner leads are bonded to the semiconductor chip with the insulating adhesive for electronic parts, signal transmission inner leads are not bonded to but kept apart from the semiconductor chip, and the signal transmission inner leads are separated from the main circuit surface of the semiconductor chip farther than the power supply inner leads are.

BRIEF DESCRIPTION OF DRAWINGS

FIG. 2(1) is a sectional view of the semiconductor device of FIG. 1 taken along line B–B', and FIG. 2(2) is a sectional view of the semiconductor device of FIG. 1 taken along line C–C'.

FIG. 4(1) is a sectional view of the semiconductor device of FIG. 3 taken along line A–A';

FIG. 4(2) is a sectional view of the semiconductor device of FIG. 3 taken along line B–B'; and FIG. 4(3) is a sectional view of the semiconductor device of FIG. 3 taken along line C–C'.

BEST MODE FOR CARRYING OUT THE INVENTION

Hereinafter, the insulating adhesive for electronic parts of the present invention and the lead frame and semiconductor device using the insulating adhesive will be described in detail.

The insulating adhesive for electronic parts of the present invention, which satisfies the requirements (A) and (B) of the resin and (C) of the insulating adhesive, can be handled easily without protruding or dripping from lead frames, thereby preventing failure in the production of semiconductor devices, such as inaccuracy in sizes, packaging failure or pollution of production facilities.

Examples of resins usable in the insulating adhesive of the present invention include polyether resin, polyester resin, polyamide resin, polyimide resin, polyamide-imide resin, polyetheramide resin, acrylic resin, epoxy resin, bismaleimide resin, silicone resin and mixtures thereof. It is possible to use any resin which has the properties (A) and (B) and can endow the insulating adhesive with the property (C) when used with a solvent.

Among the above-described resins, those containing 1 to 50% by weight, preferably 10 to 40% by weight of polar groups, such as amide, imide or epoxy groups, are desirable to improve bonding strength. Crosslinking agents, such as those for epoxy resin or bismaleimide resin, coupling agents and colorants may be added when necessary.

Among the above-described various resins, polyamide-imide resin and polyimide resin are preferable because of their excellence in heat resistance and insulating properties, with aromatic polyamide-imide resin and aromatic polyimide resin particularly preferred.

The resin to be used in the present invention has a weight average molecular weight of 30,000 to 300,000 based on conversion into polystyrene, preferably 50,000 to 150,000. Resins of weight average molecular weights of less than 30,000 cause difficulties in coating procedure, and, after bonding, form cured film which is so fragile as to deteriorate the heat resistance reliability of semiconductor devices. Resins of weight average molecular weights of more than 300,000 are less soluble in solvents and are less adhesive to lead frames.

The resin to be used in the present invention has a ratio of weight average molecular weight (Mw)/number average molecular weight (Mn) (Mw/Mn) of 5 or less, preferably 1.5 to 3. Resins having a ratio of weight average molecular weight/number average molecular weight (Mw/Mn) of more than 5 are less wettable against lead frames and cause sagging or crawling, and deteriorate not only workability but also the heat resistance of semiconductor devices.

Herein, weight average molecular weight and number average molecular weight are determined by gel permeation chromatography using a working curve of standard polystyrene.

Examples of coupling agents, which may be added according to demand, include silane coupling agents, such as vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropylmethyldimethoxysilane, γ-aminopropyltriethoxysilane, N-phenyl-γ-aminopropyltrimethoxysilane and γ-mercaptopropyltrimethoxysilane, titanate coupling agents, aluminate coupling agents and zircoaluminate coupling agents. When coupling agents are added, the amount of coupling agents is in general 0.01 to 20% by weight, preferably 0.1 to 10% by weight based on the resin.

When colorants are added, the amount of colorants is in general 0.1 to 50% by weight, preferably 3 to 30% by weight.

The solvent to be used in the insulating adhesive of the present invention may be selected from any solvents which dissolve the resin used, and non-limitative examples include aromatic solvents, such as benzene, toluene and xylene; ketone solvents, such as acetone, methyl ethyl ketone, methyl isobutyl ketone and cyclohexanone; ether solvents, such as diethyl ether, diisopropyl ether, tetrahydrofuran, dioxane, ethylene glycol dimethyl ether, ethylene glycol diethyl ether, diethylene glycol dimethyl ether and diethylene glycol diethyl ether; ester solvents, such as ethyl acetate, n-propyl acetate, isopropyl acetate, n-butyl acetate, ethylene glycol monomethyl ether acetate, ethylene glycol monoethyl ether acetate, ethylene glycol monobutyl ether acetate, diethylene glycol monomethyl ether acetate, diethylene glycol monomethyl ether acetate, propylene glycol monomethyl ether acetate, propylene glycol monomethyl ether acetate, propylene glycol monoethyl ether acetate and γ-butyrolactone; and amide solvents, such as dimethylformamide, dimethylacetamide and N-methylpyrrolidone. These solvents may be used individually or in combination of two or more.

Among the solvents described above, the preferred are amide solvents, such as N-methylpyrrolidone and dimethylformamide, and ester solvents, such as ethylene glycol monobutyl ether acetate, because of their excellence in solubility and availability.

The amount of the solvent to be used in the insulating adhesive of the present invention is preferably such that the resin is 5 to 40% by weight, more preferably 10 to 30% by weight, particularly preferably 15 to 25% by weight, based on the total of the solvent and the resin.

To control the flowability of the insulating adhesive of the present invention, inorganic fillers, such as silica, alumina, zirconia, titania, calcium carbonate, magnesium carbonate, magnesium oxide, diamond powder, quartz powder and mica, resin fillers (organic fillers), such as fluorine resin, or rubber fillers, such as acrylic rubber, butadiene rubber, nitrile rubber and silicone rubber, may be added. When fillers are added, the amount of fillers is preferably 10 to 200% by weight, more preferably 15 to 100% by weight, based on the amount of the resin.

The insulating adhesive of the present invention has a viscosity of 5,000 to 100,000 mPa.s, preferably 7,000 to 60,000 mPa.s as measured with an E-type viscometer at 25° C. at 10 rpm. If the viscosity is less than 5,000 mPa.s, the insulating adhesive will drip from lead frames, and if more than 100,000 mPa.s, the insulating adhesive will be difficult to apply to lead frames, and voids may occur after drying.

The insulating adhesive of the present invention has a viscosity ratio (η1 rpm/η10 rpm) of 1.0 to 6.0, preferably 1.0 to 3.0. The viscosity ratio, in general, does not become less than 1.0, and if it is more than 6.0, the flowability and coating workability of the insulating adhesive will decrease.

When applied to lead frames, the insulating adhesive of the present invention preferably comes in contact with lead frames at a contact angle of 20 to 130°. If the contact angle is less than 20°, the insulating adhesive may drip considerably from lead frames, and semiconductor chips may incline due to the thinner coating of the insulating adhesive and come to contact with lead frames, causing connection failure. Further, semiconductor devices may be less reliable because sealing materials cannot get into the space between the semiconductor chip and lead frame sufficiently. If the contact angle is more than 130°, coating failure may occur due to the crawling of the insulating adhesive.

When applied to lead frames, the insulating adhesive of the present invention, before drying, preferably has an aspect ratio of 0.05 to 2.0, more preferably 0.1 to 1.0. If the aspect ratio is less than 0.05 before drying, the amount of coating may be too little to bond semiconductor chips with high bonding strength. If the aspect ratio is more than 2.0 before drying, the adhesive may glue to the backside of inner leads, to hinder the wire bonding between inner leads and semiconductor chips. Herein, "aspect ratio" is the height of the coating of an adhesive divided by the diameter of the base of the coating, and indicates the coating ability of the adhesive.

When the insulating adhesive of the present invention is applied to lead frames and then dried, the dried insulating adhesive preferably has an aspect ratio of 0.005 or more. If the dried insulating adhesive has an aspect ratio of less than 0.005, it may be too thin to absorb the mechanical impact at the time of bonding semiconductor chips, and the bonding strength may be insufficient.

The aspect ratios of the insulating adhesive before and after drying may be adjusted to the above ranges by controlling the molecular weight of the resin, by the solvent, or by fillers added optionally to control flowability.

When the insulating adhesive of the present invention is applied to lead frames, dried and then forced to absorb moisture, the moistened insulating adhesive foams preferably at 200° C. or higher, more preferably 230° C. or higher. If the foaming temperature is lower than 200° C., semiconductor packages may be less tolerable to solder reflow and tend to crack on solder reflow.

When the insulating adhesive of the present invention is applied to lead frames, dried and then forced to absorb moisture, the moistened insulating adhesive preferably has a glass transition temperature of 100 to 250° C. If the glass transition temperature of the moistened insulating adhesive is lower than 100° C., packages may crack during solder reflow. If the glass transition temperature of the moistened insulating adhesive is higher than 250° C., high temperatures may be required for bonding semiconductor chips, thereby impairing workability and reliability.

Herein, the procedure of "drying an insulating adhesive" that is performed to measure the above-described aspect ratios, foaming temperature and glass transition temperature, means removing solvents from the insulating adhesive by heating.

The lead frame of the present invention is obtainable by applying the insulating adhesive of the present invention to a lead frame, and drying it to form a precured adhesive layer. The coating method is not limited, and non-limitative examples include dispenser coating, printing and stamping. The drying temperature for the insulating adhesive of the present invention is not particularly limited, and depends on the kinds and contents of the solvents used. The solvents in the insulating adhesive need not be removed completely by the drying. After an adhesive layer is formed on the lead frame in the above-described manner, the lead frame and a semiconductor chip are laid on top of the other and then bonded together with heat and pressure.

Any lead frames, which are commonly used in semiconductor devices, may be used, and non-limitative and preferred examples include 42-alloy lead frames, Cu-lead frames and metal-plated lead frames.

In the semiconductor device of the present invention, a semiconductor chip and a lead frame are bonded together by the insulating adhesive of the present invention. The insulating adhesive of the present invention can be used by itself, and may be applied directly to semiconductor chips, or be applied to lead frames and precured before bonding.

A semiconductor chip and a lead frame are bonded together, in general, at a temperature of 70 to 400° C. at a pressure of 0.05 to 10 kg/cm² for a pressing time of 0.1 to 3 seconds.

In the semiconductor device of the present invention, it is preferable that 0.05 to 20%, more preferably 0.1 to 10% of the surface of the semiconductor chip facing to the lead frame is in contact with the insulating adhesive. If the area contacting the insulating adhesive is less than 0.05% of the surface of the semiconductor chip, the bonding strength between the lead frame and the semiconductor chip may be reduced, and the semiconductor chip may slip off on transportation or connection with bonding wires. If the area contacting the insulating adhesive is more than 20% of the surface of the semiconductor chip, packages may crack during solder reflow.

Controlling the aspect ratios of the applied insulating adhesive or the foaming temperature and glass transition temperature of the moistened insulating adhesive also prevents the reduction in bonding strength and the package-cracking during solder reflow.

In a semiconductor device of a preferred embodiment according to the present invention, inner leads of a lead frame are placed over the main circuit surface of a semiconductor chip and are connected to an electrode pad on the semiconductor chip with metal wires, the semiconductor chip, the inner leads and the metal wires are sealed with a sealing material, and at least two of the inner leads are bonded to the semiconductor chip with the insulating adhesive for electronic parts of the present invention. When only one inner lead is bonded to the semiconductor chip with the insulating adhesive for electronic parts, the semiconductor chip may become ill-balanced and incline or slip off on connection of bonding wires or transportation.

Figure 1:
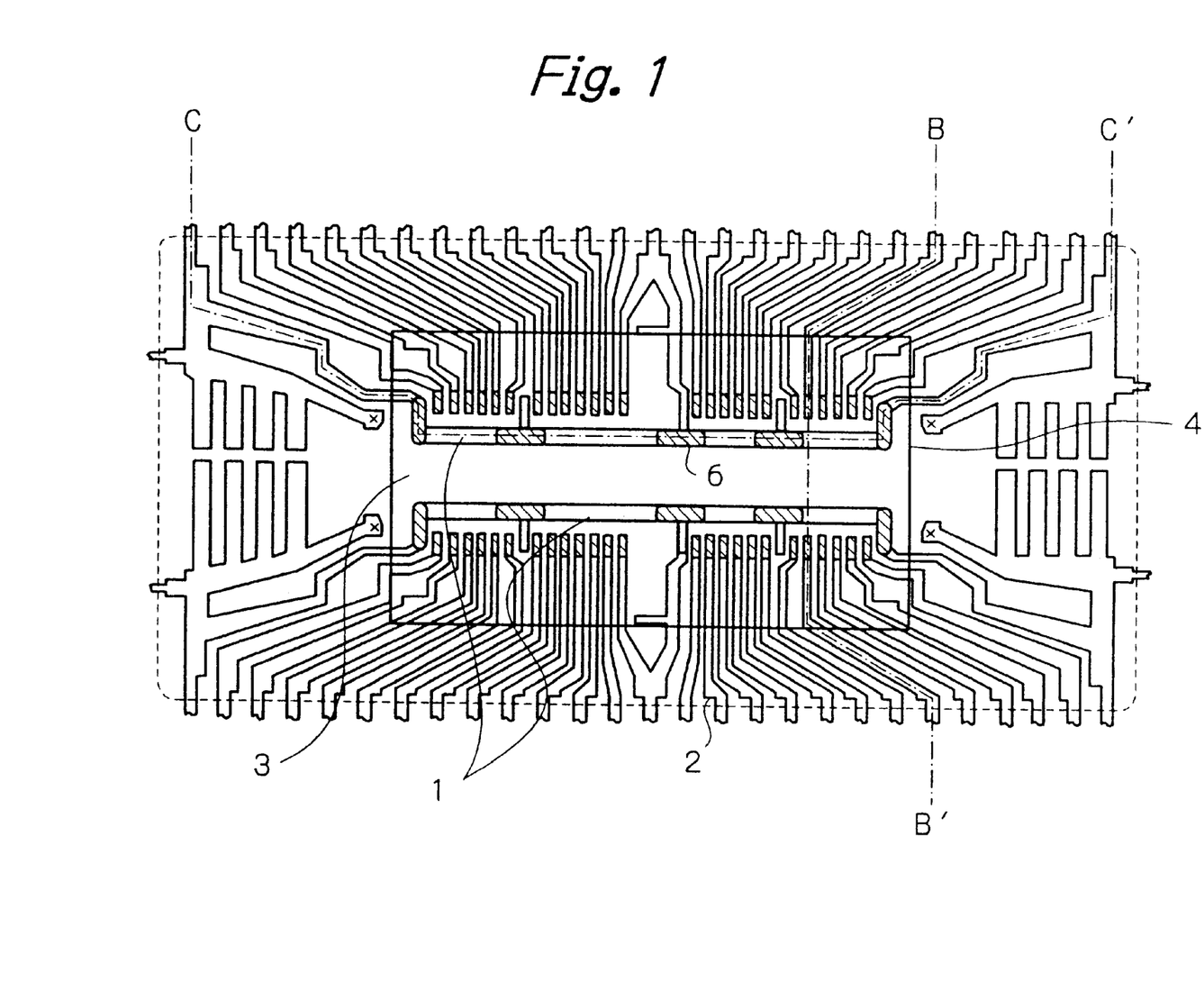
FIG. 1 is a plan view showing a lead frame and a semiconductor chip in a semiconductor device of an embodiment according to the present invention.
Figure 2:
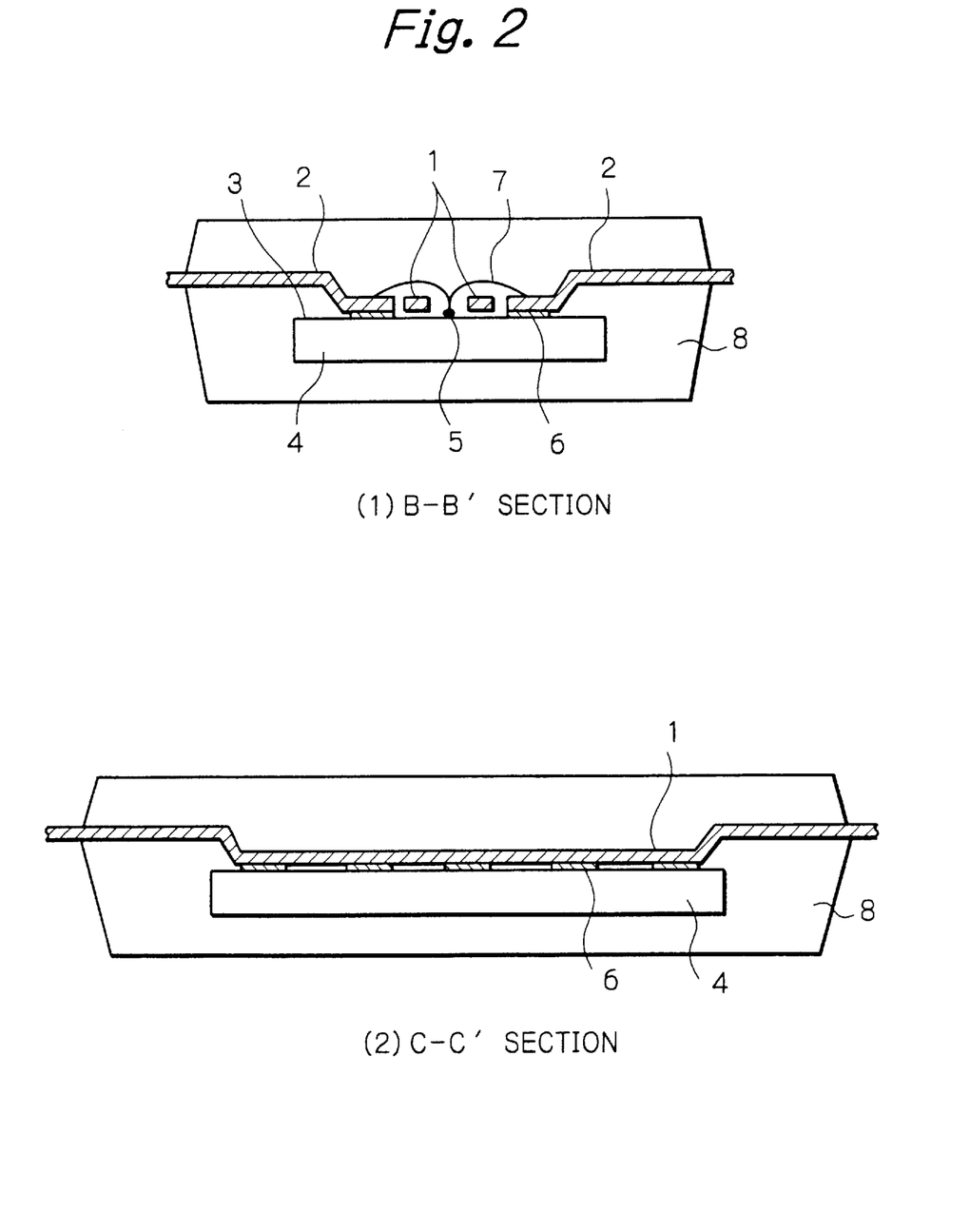

FIG. 1 and FIG. 2 show a semiconductor device of the above-described embodiment. FIG. 1 is a plan view showing the inside of the semiconductor device, FIG. 2(1) is a sectional view of FIG. 1 taken along line B–B', and FIG. 2(2) is a sectional view of FIG. 1 taken along line C–C'. All power supply inner leads 1 and signal transmission inner leads 2 are bonded to main circuit surface 3 of semiconductor chip 4 with insulating adhesive for electronic parts 6 of the present invention. This structure is applicable for semiconductor devices wherein the electric capacity between signal transmission inner leads 2 and main circuit surface 3 of semiconductor chip 4 does not adversely affect the performance of the semiconductor devices. Metal wires 7 connect signal transmission inner leads 2 to electrode pad 5 on main circuit surface 3 of semiconductor chip 4, and semiconductor chip 4, inner leads (1, 2) and metal wires 7 are sealed with sealing material 8.

In a semiconductor device of another preferred embodiment according to the present invention, inner leads of a lead frame are placed over the main circuit surface of a semiconductor chip and are connected to an electrode pad on the semiconductor chip with metal wires, the semiconductor chip, the inner leads and the metal wires are sealed with a sealing material, power supply inner leads are bonded to the semiconductor chip with the insulating adhesive for electronic parts of the present invention, signal transmission inner leads are not bonded to but kept apart from the semiconductor chip, and the signal transmission inner leads are separated from the main circuit surface of the semiconductor chip farther than the power supply inner leads are. If the space between the signal transmission inner leads and the semiconductor chip is narrower than that between the power supply inner leads and the semiconductor chip, the electric capacity between the signal transmission inner leads and the main circuit surface of the semiconductor chip may adversely affect the performance of the semiconductor device, and the metal wires may contact the power supply inner leads.

Figure 3:
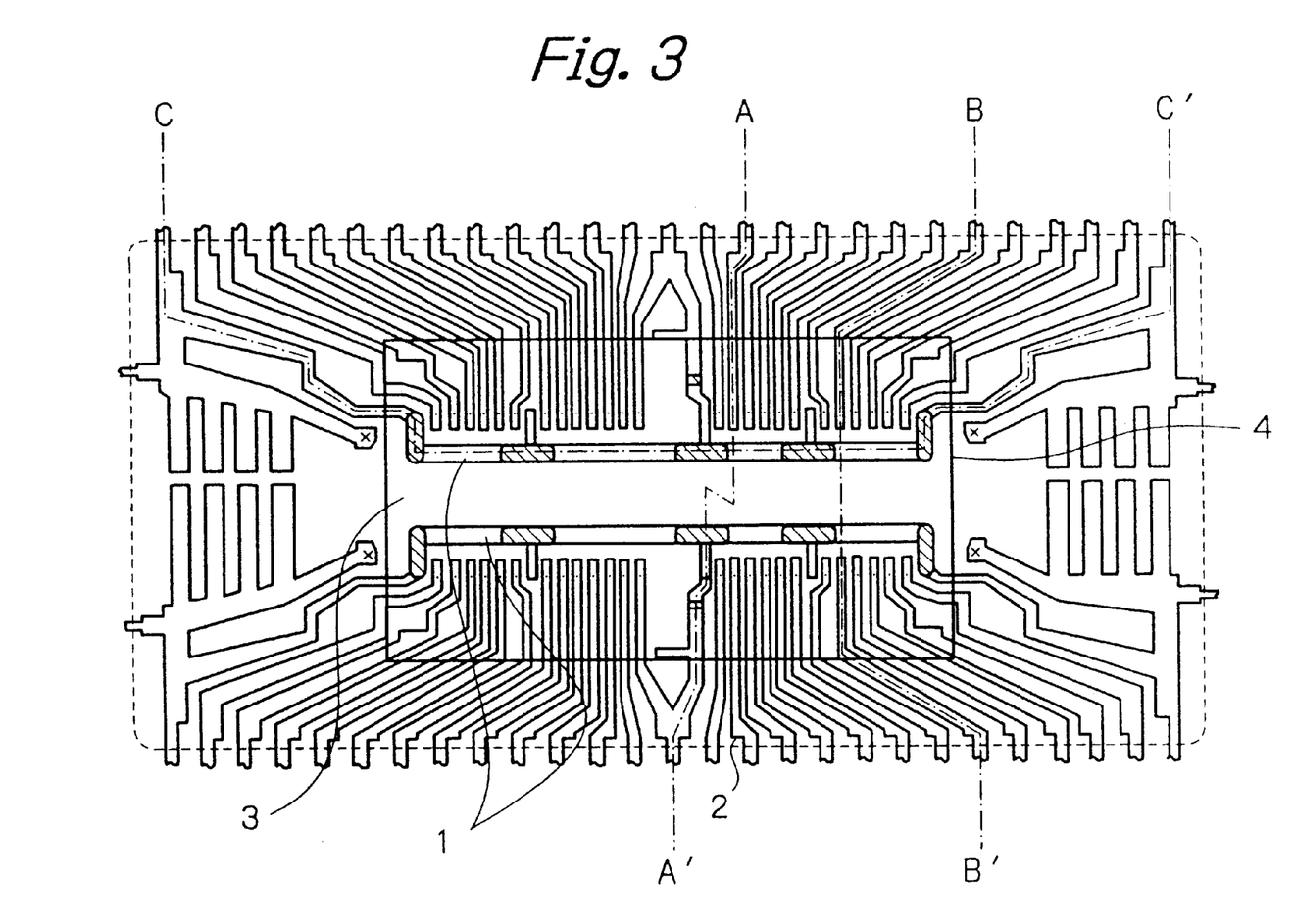
FIG. 3 is a plan view showing a lead frame and a semiconductor chip in a semiconductor device of another embodiment according to the present invention.
Figure 4:
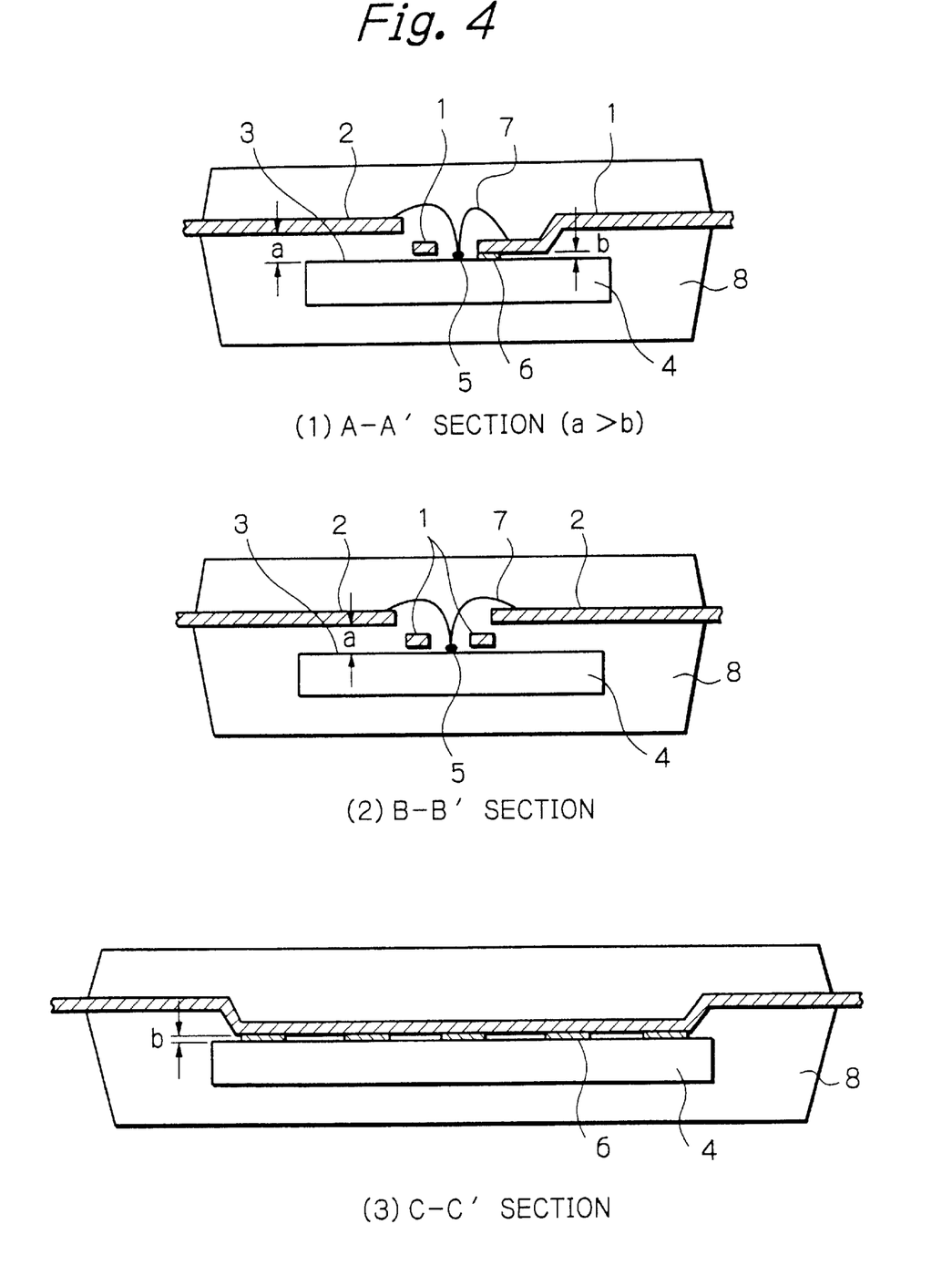

FIG. 3 and FIG. 4 show a semiconductor device of the above-described embodiment. FIG. 3 is a plan view showing the inside of the semiconductor device, FIG. 4(1) is a sectional view of FIG. 3 taken along line A–A', FIG. 4(2) is a sectional view of FIG. 3 taken along line B–B', and FIG. 4(3) is a sectional view of FIG. 3 taken along line C–C'. Only two power supply inner leads 1 (bus bars), which traverse semiconductor chip 4 lengthwise about center line, are bonded to main circuit surface 3 of semiconductor chip 4 by insulating adhesive for electronic parts 6 of the present invention. The problem of the bad influence on the performance of semiconductor chip 4 owing to the electric capacity between signal transmission inner leads 2 and main circuit surface 3 of semiconductor chip 4 is solved by separating signal transmission inner leads 2 from main circuit surface 3 of semiconductor chip 4 with a space "a" that is larger than the space "b" between power supply inner leads 1 and main circuit surface 3 of semiconductor chip 4. This structure also improves assembling workability because metal wires 7 are prevented from contacting power supply inner leads 1 on connecting electrode pad 5 on chip with the ends of signal transmission inner leads 2.

The modulus of elasticity of the insulating adhesive for electronic parts of the present invention is not particularly limited, and is preferably 1 MPa or more, more preferably 10 MPa or more at 200 to 270° C. Herein, the terms "modulus of elasticity" mean the modulus of elasticity of a completely cured insulating adhesive as measured at 200 to 270° C.

The method of applying the insulating adhesive for electronic parts of the present invention is not particularly limited, and non-limitative examples include dispenser coating, printing and stamping. The temperature at which the insulating adhesive for electronic parts of the present invention is dried is not particularly limited but depends on the solvent used and concentration.

The method of bonding semiconductor chips with lead frames by using the insulating adhesive for electronic parts of the present invention is not particularly limited, and a method most suitable for the objective package may be selected.

The insulating adhesive for electronic parts of the present invention having the above-described specific properties enables producing semiconductor devices without using conventional insulating adhesive film, thereby improving the reliability of semiconductor devices.

EXAMPLES

Hereinafter the present invention will be described in more detail with reference to the following Examples, which, however, are not to be construed to limit the scope of the invention.

Synthesis Example 1

In a 50 ml four-neck flask equipped with an agitator, a thermometer, a nitrogen gas inlet and a calcium chloride tube, 3.895 g (9.5 mmoles) of BAPP (2,2-bis[4-(4-aminophenoxy)phenyl]propane) and 0.125 g (0.5 mmoles) of silicone diamine (1,3-bis(aminopropyl) tetramethyldisiloxane) were dissolved in 23.0 g of N-methylpyrrolidone (NMP), and then 2.13 g (10 mmoles) of anhydrous trimellitic chloride was added gradually while cooling to 5° C. or lower. After addition of 2.02 g (20 mmoles) of triethylamine, the mixture was allowed to react at 5° C. or lower for 5 hours, and then heated to 180° C. for 5 hours, to synthesize a polyamide-imide.

Water was added to the polyamide-imide varnish thus obtained, and the resulting precipitate was separated, ground and dried, to give polyamide-imide powder.

Synthesis Example 2

Polyimide powder was prepared in the same manner as in Synthesis Example 1, except that the BAPP and silicone diamine used in Example 1 were replaced by 2.74 g (7.5 mmoles) of IPDDM (4,4'-diamino-3,3',5,5'-tetraisopropyldiphenylmethane) and 1.025 g (2.5 mmoles) of BAPP, and the anhydrous trimellitic chloride used in Synthesis Example 1 was replaced by 5.76 g (10 mmoles) of BABT (bisphenol A bistrimellitate dianhydride).

Synthesis Example 3

Polyamide-imide powder was prepared in the same manner as in Synthesis Example 1, except that the amount of BAPP was changed to 2.87 g (7 mmoles) and the amount of the silicone diamine (1,3-bis(aminopropyl) tetramethyldisiloxane) was changed to 0.75 g (3 mmoles).

Synthesis Example 4

Polyamide-imide powder was prepared in the same manner as in Synthesis Example 1, except that the amount of BAPP was changed to 2.05 g (5 mmoles) and the amount of the silicone diamine (1,3-bis(aminopropyl) tetramethyldisiloxane) was changed to 1.25 g (5 mmoles).

In the following Examples and Comparative Examples, productions of lead frames coated with insulating adhesive for electronic parts, productions of semiconductor chips, and measurements of molecular weights, viscosities, contact angles, aspect ratios, foaming temperatures and glass transition temperatures were carried out as follows.

0.02 ml of an insulating adhesive for electronic parts prepared using the above resin powder was applied, as shown in FIG. 1, to inner leads of a lead frame at 50 points by using a dispenser, and then dried by heating to 90° C. for 10 minutes and to 250° C. for 10 minutes (for 42-alloy lead frames), or by heating to 170° C. for 10 minutes (for Cu lead frames), to produce a lead frame coated with insulating adhesive for electronic parts. The adhesive layer on the lead frame was observed to evaluate the state of the dried coating.

A semiconductor device was produced by mounting a semiconductor chip of 5.5 mm×13.5 mm to the lead frame coated with insulating adhesive for electronic parts with heat and pressure (temperature: 380° C., pressure: 3 kg/cm$^2$, pressing time: 3 seconds), connecting the ends of the inner leads to the semiconductor chip with bonding wires, and sealing by resin molding. The sealing was carried out by molding a sealing material CEL-9200 produced by Hitachi Chemical Company, Ltd. at 175° C. for 90 seconds at 100 kgf/cm$^2$ and then curing at 175° C. for 6 hours.

The weight average molecular weights (Mw) and ratios of weight average molecular weight (Mw)/number average molecular weight (Mn) of the above-described resins were determined by carrying out measurements using a gel permeation chromatogram (GPC: detector RI) as follows. 10 mg of a resin was introduced into a sample tube, dissolved in 5 ml of THF and filtered to obtain a measuring sample. A working curve was made by using standard polystyrene.

Column: GL-A-100M (produced by Hitachi Chemical Company, Ltd.): 2 columns (connected)

Column temperature: 25° C.

Eluant: THF

Injection: 500 µl (including 100 µl of measuring sample)

An insulating adhesive for electronic parts was applied to a glass plate and dried at 90° C. for 10 minutes and at 250° C. for 10 minutes to form a sample film, and its glass transition temperature (Tg) was then determined using a differential scanning calorimeter (DSC) under the following conditions.

Measuring conditions:

Temperature: 30–330° C.

Rate of raising temperature: 10° C./min

Amount of sample: 10 mg

Atmosphere: Air 100 ml/min

Glass transition temperatures after moisture absorption (Tgw) were measured in a high pressure closed vessel in the coexistence of a sample and 10 wt % water based on the sample.

The measurements of the viscosities of the above-described insulating adhesives for electronic parts were carried out using an E-type viscometer (produced by Nippon Keiki Co., Ltd.) with 3°-corn at 25° C. The rotation number of the corn was adjusted to 1.0 rpm to measure viscosities η1 rpm, and to 10.0 rpm to measure viscosities η10 rpm. Viscosity ratios were calculated by using the equation, viscosity ratio=η1 rpm/η10 rpm.

In a clean room of 25° C. and 60%RH, 0.02 ml of each insulating adhesive for electronic parts was applied to a lead frame at one point by using a dispenser, and the contact angle of the insulating adhesive for electronic parts against the lead frame was measured with a contact angle meter (CA-D, produced by Kyowa Kaimen Kagaku Co., Ltd.).

Each insulating adhesive for electronic parts was applied to a lead frame at one point by using a dispenser, and the sizes of the coating were measured with a contact angle meter (CA-D, produced by Kyowa Kaimen Kagaku Co., Ltd.) before and after drying [heating to 90° C. for 10 minutes and to 250° C. for 10 minutes (for 42-alloy lead frames) or by heating to 170° C. for 10 minutes (for Cu lead frames)], to determine the aspect ratios of the insulating adhesive before and after the drying. After semiconductor chips were mounted on the lead frames, the shearing bonding strength of the semiconductor chips were measured.

Each insulating adhesive for electronic parts was applied to lead frames, and dried [by heating to 90° C. for 10 minutes and to 250° C. for 10 minutes (for 42-alloy lead frames) or by heating to 170° C. for 10 minutes (for Cu lead frames)]. The lead frames were then dipped in water for 24 hours to force the insulating adhesive to absorb moisture, and were placed separately on hot plates adjusted to different temperatures. The temperatures of the hot plates on which foaming occurred were read, and the lowest temperature was defined as the foaming temperature of the moistened insulating adhesive.

The solder reflow resistances of semiconductor devices produced by using the above-described insulating adhesives for electronic parts we re evaluated by moistening the semiconductor devices at 85° C. at 85%RH for 48 hours, subjecting them to solder reflow in an IR furnace of 245° C., and examining the presence of crack in the packages by visual observation and by an ultrasonic defectoscope (HYE-FOCUS, produced by Hitachi Kenki Co., Ltd.).

EXAMPLE 1

Polyamide-imide powder was prepare d in the manner as described in Synthesis Example 1. It had a weight average molecular weight (Mw) of 80,000 and a ratio of weight average molecular weight/number average molecular weight (Mw/Mn) of 1.5. An adhesive was prepared by dissolving the resin in a solvent mixture of N-methylpyrrolidone (NMP)/ethylene glycol monobutyl ether acetate (BuCA) to 30 wt % concentration. The adhesive was diluted with the NMP/BuCA solvent mixture (weight ratio: 7/3) to a viscosity of 30,000 mPa.s (η10 rpm). The diluted adhesive had a resin concentration of 27 wt % and a viscosity ratio (η1 rpm/η10 rpm) of 1.0.

The adhesive of 30 wt % resin concentration was applied to a glass plate and dried by heating to 90° C. for 10 minutes and to 250° C. for 10 minutes, to form a film, which had a Tg of 225° C. and a Tg in moistened state (Tgw) of 175° C. The adhesive of 27 wt % resin concentration was applied to a 42-alloy lead frame with a dispenser, to determine its contact angle against the lead frame, the appearance of dried coating, aspect ratios before and after drying, chip-bonding strength and foaming temperature. The results are given in Table 1. Table 1 also gives the solder reflow resistance of a package, which was evaluated by examining the presence of crack.

Comparative Example 1

The procedure of Example 1 was repeated, except that the adhesive was adjusted to a viscosity of 500 mPa.s (resin concentration: 12 wt %). The results of measurements are given in Table 1.

Comparative Example 2

The procedure of Example 1 was repeated, except that the adhesive of 27 wt % resin concentration prepared in Example 1 was adjusted to a viscosity of 300,000 mPa.s by addition of 20 wt % silica filler (trade name: FB-35, produced by Denki Kagaku Kogyo Co., Ltd.) based on the resin. The results of measurements are given in Table 1.

EXAMPLE 2

Polyimide powder was prepared according to Synthesis Example 2. It had a weight average molecular weight (Mw) of 120,000 and a ratio of weight average molecular weight/number average molecular weight (Mw/Mn) of 2.2. An adhesive was prepared by dissolving the resin in dimethylformamide (DMF) to 30 wt % concentration. The adhesive had a Tg of 250° C. and a Tg in moistened state (Tgw) of 210° C. as measured in the same manner as in Example 1.

When the adhesive was diluted with DMF to a viscosity of 50,000 mPa.s (η10 rpm)(resin concentration: 27 wt %), the diluted adhesive had a viscosity ratio (η1 rpm/η10 rpm) of 1.0. By using the adhesive of 27 wt % resin concentration, observation of the appearance of dried coating and measurements of contact angle against a lead frame, aspect ratios before and after drying, chip-bonding strength and foaming temperature were carried out. The results are given in Table 1. Table 1 also gives the solder reflow resistance of a package evaluated by examining the presence of crack.

EXAMPLE 3

Polyamide-imide powder was prepared according to Synthesis Example 3. It had a weight average molecular weight (Mw) of 60,000 and a ratio of weight average molecular weight/number average molecular weight (Mw/Mn) of 1.7. An adhesive was prepared by dissolving the resin in NMP to 30 wt % concentration and adding thereto 10 wt % of a silane coupling agent (Trade name: SH6040, produced by Dow Corning Toray Silicone Co., Ltd.) based on the resin. The adhesive had a Tg of 180° C. and a Tg in moistened state (Tgw) of 130° C. as measured in the same manner as in Example 1.

When the adhesive was diluted with NMP to a viscosity of 8,000 mPa.s (η10 rpm)(resin concentration in total of resin and solvent: 20 wt %), the diluted adhesive had a viscosity ratio (η1 rpm/η10 rpm) of 1.0. By using the adhesive of 20 wt % resin concentration, observation of the appearance of dried coating and measurements of contact angle against a lead frame, aspect ratios before and after drying, chip-bonding strength and foaming temperature were carried out. The results are given in Table 1. Table 1 also gives the solder reflow resistance of package evaluated by examining the presence of crack.

EXAMPLE 4

Polyamide-imide powder was prepared according to Synthesis Example 1, except that the amount of anhydrous trimellitic chloride was changed to 2.17 g. It had a weight average molecular weight (Mw) of 110,000 and a ratio of weight average molecular weight/number average molecular weight (Mw/Mn) of 1.8. An adhesive was prepared by dissolving the resin in NMP to 30 wt % concentration and adding thereto 10 wt % of a silane coupling agent (Trade name: SH6040, produced by Dow Corning Toray Silicone Co., Ltd.) based on the resin. The adhesive had a Tg of 230° C. and a Tg in moistened state (Tgw) of 190° C. as measured in the same manner as in Example 1.

When the adhesive was adjusted to a viscosity of 40,000 mPa.s (η10 rpm) by adding 20 wt % of a silicone rubber filler (Trade name: TOREFIL E-601, produced by Dow Corning Toray Silicone Co., Ltd.) based on the resin and then diluting with NMP (resin concentration in total of resin and solvent: 23 wt %), the diluted adhesive had a viscosity ratio (η1 rpm/η10 rpm) of 1.5. After the adjustment of viscosity, by using the adhesive of 23 wt % resin concentration, observation of the appearance of dried coating and measurements of contact angle against a lead frame, aspect ratios before and after drying, chip-bonding strength and foaming temperature were carried out. The results are given in Table 1. Table 1 also gives the solder reflow resistance of package evaluated by examining the presence of crack.

Comparative Example 3

Polyamide-imide powder was prepared according to Synthesis Example 1, except that the amount of anhydrous trimellitic chloride was changed to 2.45 g. It had a weight average molecular weight of 10,000 and a ratio of weight average molecular weight/number average molecular weight (Mw/Mn) of 1.4. An adhesive having a viscosity adjusted to 3,000 mPa.s (η10 rpm)(resin concentration: 20 wt %) with NMP was prepared and evaluated in the same manner as in Example 1. The results are given in Table 1.

Comparative Example 4

Polyamide-imide powder was prepared according to Synthesis Example 4. It had a weight average molecular weight (Mw) of 28,000 and a ratio of weight average molecular weight/number average molecular weight (Mw/Mn) of 1.6. An adhesive was prepared by dissolving the resin with NMP to 30 wt % concentration. The adhesive had a Tg of 140° C. and a Tg in moistened state (Tgw) of 90° C. as measured in the same manner as in Example 1.

When the adhesive was diluted with NMP to a viscosity of 8,000 mPa.s (η10 rpm)(resin concentration: 25 wt %), the diluted adhesive had a viscosity ratio (η1 rpm/η10 rpm) of 1.0. After the adjustment of viscosity, by using the adhesive of 25 wt % resin concentration, observation of the appearance of dried coating and measurements of contact angle against a lead frame, aspect ratios before and after drying, chip-bonding strength and foaming temperature were carried out. The results are given in Table 1. Table 1 also gives the solder reflow resistance of package evaluated by examining the presence of crack.

EXAMPLE 5

A lead frame and a semiconductor chip were bonded together with the adhesive of 27 wt % resin concentration prepared in Example 1. Then connection with bonding wires and resin molding were carried out to produce a semiconductor device as shown in FIG. 1 and FIG. 2. Sealing was carried out using a sealing material CEL-9200 produced by Hitachi Chemical Company, Ltd. at 175° C. for 90 seconds at a pressure of 100 kgf/cm$^2$, followed by curing at 175° C. for 6 hours. The adhesive was applied to the lead frame so that the total bonding area was 2% of the area of a surface of the semiconductor chip. When the lead frame was dropped from a height of 1 m after bonding the semiconductor chip, the chip did not separate. This indicates that the adhesive had a strong bonding strength. The yield factor of wire bonding was 100%, showing good workability.

TABLE 1

| | Example 1 | Comp. Example 2 | Comp. Example 2 | Example 2 |
|---|---|---|---|---|
| Resin | polyamide-imide | polyamide-imide | polyamide-imide | polyimide |
| Mw | 80,000 | 80,000 | 80,000 | 120,000 |
| Mw/Mn | 1.5 | 1.5 | 1.5 | 2.2 |
| Tg (° C.) | 225 | 225 | 225 | 250 |
| Tgw (° C.) | 175 | 175 | 175 | 210 |
| η 10 rpm (mPa · s) | 30,000 | 500 | 300,000 | 50,000 |
| η 1 rpm/η 10 rpm | 1.0 | 1.0 | 1.5 | 1.0 |
| Solvent | NMP/BuCA | NMP/BuCA | NMP/BuCA | DMF |
| Contact angle/lead frame | 40°/42-alloy | 5°/42-alloy | 70°/42-alloy | 45°/42-alloy |
| Aspect ratio (before drying) | 0.5 | 0.03 | 1.2 | 0.7 |
| Aspect ratio (after drying) | 0.1 | 0.003 | 0.4 | 0.2 |
| Appearance of dried coating | Good | Thin, Overflow to sides and back | Many voids | Good |
| Chip bonding strength (kgf/chip) | 1.5 | 0.1 | 0.7 | 1.2 |
| Foaming temperature (° C.) | 230 | could not be determined | could not be determined | 240 |
| Presence of crack in package after solder reflow | None | Inapplicable for package production | Inapplicable for package production | None |

| | Example 3 | Example 4 | Comp. Example 3 | Comp. Example 4 |
|---|---|---|---|---|
| Resin | Polyamide-imide | Polyamide-imide | Polyamide-imide | Polyamide-imide |
| Mw | 60,000 | 110,000 | 10,000 | 28,000 |
| Mw/Mn | 1.7 | 1.8 | 1.4 | 1.6 |
| Tg (° C.) | 180 | 230 | 220 | 140 |
| Tgw (° C.) | 130 | 190 | 160 | 90 |
| η 10 rpm (mPa · s) | 8,000 | 40,000 | 3,000 | 8,000 |
| η 1 rpm/η 10 rpm | 1.0 | 1.5 | 1.0 | 1.0 |
| Solvent | NMP | NMP | NMP | NMP |
| Contact angle/lead frame | 30°/Cu | 50°/42-alloy | could not be measured | 40°/Cu |
| Aspect ratio | 0.3 | 0.8 | could not | 0.3 |

TABLE 1-continued

| | | | | |
|---|---|---|---|---|
| (before drying) | | | be measured | |
| Aspect ratio (after drying) | 0.07 | 0.3 | could not be measured | 0.05 |
| Appearance of dried coating | Good | Good | Coating was too fragile to form film. | Good |
| Chip bonding strength (kgf/chip) | 1.3 | 1.5 | could not be measured | 0.5 |
| Foaming temperature (° C.) | 200 | 280 | could not be determined | 150 |
| Presence of crack in package after solder reflow | None | None | Inapplicable for package production | Many |

INDUSTRIAL APPLICABILITY

The insulating adhesive for electronic parts of the present invention enables the production of lead frames suitable particularly for semiconductor devices of LOC (Lead On Chip) or COL (Chip On Lead) structure, and also enables the production of highly reliable semiconductor devices.

What is claimed is:

1. An insulating adhesive for an electronic part, which is to be used for bonding a semiconductor chip to a lead frame and comprises a resin and a solvent, the resin having
    (A) a weight average molecular weight (Mw) of 30,000 to 300,000 based on conversion into polystyrene and
    (B) a ratio of weight average molecular weight (Mw)/number average molecular weight (Mn) of 5 or less, and
    (C) the insulating adhesive for an electronic part having a viscosity of 5,000 to 100,000 mPa.s at a rotation number of 10 rpm and a viscosity ratio ($\eta$1 rpm/$\eta$10 rpm) of 1.0 to 6.0 as measured at 25° C. with an E-type viscometer.

2. The insulating adhesive for an electronic part as claimed in claim 1, which when it is applied to a lead frame, comes in contact with the lead frame at a contact angle of 20° to 130° and at an aspect ratio of 0.05 to 2.0 before drying and, after drying, at an aspect ratio of 0.005 or more.

3. The insulating adhesive for an electronic part as claimed in claim 1, which when it is applied to a lead frame, dried and then forced to absorb moisture, foams at 200° C. or more.

4. The insulating adhesive for an electronic part as claimed in claim 1, which when it is applied to a lead frame, dried and then forced to absorb moisture, has a glass transition temperature of 100 to 250° C.

5. The insulating adhesive for an electronic part as claimed in claim 1, wherein the resin is a polyimide resin or a polyamide-imide resin.

6. The insulating adhesive for an electronic part as claimed in claim 1, which further comprises 0.01 to 20% by weight of a silane coupling agent based on the weight of the resin.

7. The insulating adhesive for an electronic part as claimed in claim 1, which further comprises 10 to 200% by weight of a silicone rubber filler based on the weight of the resin.

8. A lead frame, which bears an adhesive layer formed by applying the insulating adhesive for an electronic part as claimed in claim 1 to the lead frame and then drying.

9. A semiconductor device comprising a lead frame and a semiconductor chip, the lead frame and the semiconductor chip being bonded together with the insulating adhesive for an electronic part of claim 1.

10. The semiconductor device as claimed in claim 9, wherein the lead frame bears an adhesive layer formed by applying the insulating adhesive for an electronic part of claim 1 to the lead frame and then drying, and the semiconductor is bonded to the lead frame with the adhesive layer.

11. The semiconductor device as claimed in claim 9, wherein 0.05 to 20% area of a surface of the semiconductor chip is in contact with the insulating adhesive for an electronic part.

12. The semiconductor device as claimed in claim 9, wherein inner leads of the lead frame are placed over a main circuit surface of the semiconductor chip and are connected to an electrode pad on the semiconductor chip with metal wires, the semiconductor chip, the inner leads and the metal wires are sealed with a sealing material, and at least two of the inner leads are bonded to the semiconductor chip with the insulating adhesive for an electronic part.

13. The semiconductor device as claimed in claim 9, wherein inner leads of the lead frame are placed over a main circuit surface of the semiconductor chip and are connected to an electrode pad on the semiconductor chip with metal wires, the semiconductor chip, the inner leads and the metal wires are sealed with a sealing material, power supply inner leads are bonded to the semiconductor chip with the insulating adhesive for an electronic part, signal transmission inner leads are not bonded to but kept apart from the semiconductor chip, and the signal transmission inner leads are separated from the main circuit surface of the semiconductor chip farther than the power supply inner leads are.

* * * * *